(12) United States Patent
Kurokawa et al.

(10) Patent No.: US 6,737,996 B2
(45) Date of Patent: May 18, 2004

(54) INFORMATION RECORDING AND REPRODUCING METHOD

(75) Inventors: Takahiro Kurokawa, Kokubunji (JP); Harukazu Miyamoto, Higashimurayama (JP); Hiroyuki Minemura, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/370,479

(22) Filed: Feb. 24, 2003

(65) Prior Publication Data

US 2004/0070524 A1 Apr. 15, 2004

(30) Foreign Application Priority Data

Oct. 11, 2002 (JP) ........................................ 2002-298229

(51) Int. Cl.⁷ ................................................ H03M 7/00
(52) U.S. Cl. ............................. 341/68; 341/59; 360/41; 369/59.13
(58) Field of Search .............................. 341/58, 59, 68, 341/69; 360/41, 42; 369/59.13, 59.14, 59.15, 59.16, 59.17, 59.18, 59.19, 59.2, 59.21, 59.22, 59.23

(56) References Cited

U.S. PATENT DOCUMENTS

| 5,696,505 | A | | 12/1997 | Schouhamer Immink |
| 6,169,716 | B1 | * | 1/2001 | Buchler .................... 369/59.17 |
| 6,377,532 | B1 | * | 4/2002 | Jung et al. ................ 369/59.23 |
| 6,510,116 | B1 | * | 1/2003 | Miyagawa et al. ...... 369/59.12 |
| 2002/0145956 | A1 | * | 10/2002 | Okumura et al. .......... 369/47.5 |
| 2003/0090971 | A1 | * | 5/2003 | Gushima et al. ........... 369/47.3 |
| 2003/0227853 | A1 | * | 12/2003 | Kim et al. ................ 369/59.25 |

FOREIGN PATENT DOCUMENTS

JP      2000-163887     11/1999

* cited by examiner

*Primary Examiner*—Howard L. Williams
(74) *Attorney, Agent, or Firm*—Reed Smith LLP; Stanley P. Fisher, Esq.; Juan Carlos A. Marquez, Esq.

(57) ABSTRACT

Disclosed is a method for satisfying both high reliability and low error rate when in recording and reproducing information by making the average run length of the RLL code for recording a crystal state shorter than that for recording an amorphous state on a recording film, although the consistence of both high reliability and low error rate has been difficult in the case of conventional optical disks.

10 Claims, 13 Drawing Sheets

FIG.4

RLL (1,10) ASYNCHRONOUS RECORDING CODE (NRZ REPRESENTATION)

INPUT DATA / STATE

| | 1 | St | 2 | St | 3 | St | 4 | St |
|---|---|---|---|---|---|---|---|---|
| 0 | 000110 | 1 | 111001 | 2 | 011110 | 1 | 100001 | 2 |
| 1 | 000110 | 3 | 111001 | 4 | 011110 | 3 | 100001 | 4 |
| 2 | 000001 | 2 | 111110 | 1 | 011001 | 2 | 100110 | 1 |
| 3 | 000001 | 4 | 111110 | 3 | 011001 | 4 | 100110 | 3 |
| 4 | 000011 | 1 | 111100 | 1 | 011111 | 1 | 100000 | 1 |
| 5 | 000011 | 2 | 111100 | 2 | 011111 | 2 | 100000 | 2 |
| 6 | 000011 | 4 | 111100 | 3 | 011111 | 4 | 100000 | 3 |
| 7 | 000111 | 1 | 111000 | 1 | 011100 | 1 | 100011 | 1 |
| 8 | 000111 | 2 | 111000 | 2 | 011100 | 2 | 100011 | 2 |
| 9 | 000111 | 4 | 111000 | 3 | 011100 | 3 | 100011 | 4 |
| a | 001111 | 1 | 110000 | 1 | 011000 | 1 | 100111 | 1 |
| b | 001111 | 2 | 110000 | 2 | 011000 | 2 | 100111 | 2 |
| c | 001111 | 4 | 110000 | 3 | 011000 | 3 | 100111 | 4 |
| d | 001100 | 1 | 110011 | 1 | 000000 | 1 | 111111 | 1 |
| e | 001100 | 2 | 110011 | 2 | 000000 | 2 | 111111 | 2 |
| f | 001100 | 3 | 110011 | 4 | 000000 | 3 | 111111 | 4 |
| 0 | 001110 | 1 | 110001 | 2 | | | | |
| 1 | 001110 | 3 | 110001 | 4 | | | | |

NEXT STATE

SCRAMBLED BIT STRING

NON-SCRAMBLED BIT STRING

SCRAMBLING EQUATION: $x^8 + x^4 + x^3 + x^2 + 1$

INFORMATION RECORDING AND REPRODUCING METHOD

BACKGROUND OF THE INVENTION

1. Field of the Invention

The present invention relates to a method for recording information on optical disks and a method for reproducing the information from the optical disks.

2. Description of Related Art

A mark edge recording method has been used for recording information in optical disk systems that use such optical disks as CD and DVD media. According to the mark edge recording method, binary data "1" is assigned at the boundary (edge) between a recording mark and a space (a portion between marks) and binary data "0" is assigned at each of other portions. In this connection, in order to realize high density (high efficiency) recording that will be made over the resolution limit of the optical spots formed on the subject optical disk, a run-length limit code (RLL code) is used to limit the number of "0's" to be placed consecutively between "1" and "1". This is why the lengths of the shortest mark and the shortest space are kept longer than the optical resolution limit while such the high density recording is made. For example, in the case of the EFM code used for the CD (Compact Disk) media and the EFMPlus (or referred to as the 8-16 code) used for the DVD media are run-length limit codes in which the minimum value of the mark/space length is limited at 3T (T: a channel clock cycle). Those codes are disclosed, for example, in the official gazette of U.S. Pat. No. 5,696,505.

Both of the EFM code and the EFMPlus code (8-16 code) are (d, k) RLL codes that satisfy d=2 and k=10. Both d=2 and k=10 mentioned here mean the minimum and maximum numbers of "0's" to be placed between "1" and "1" in the run-length code. In an actual recording operation, what are recorded are not edges, but marks. Thus, "1"/"0" obtained as a result of NRZI conversion is recorded corresponding to a mark/space. In the NRZI conversion, when the run-length limit code denotes "1", the code inversion is done like "1"→"0" and "0"→"1". When the run-length limit code denotes "0", the code is kept as is in the conversion. Consequently, d+1 is assumed as the minimum mark/space length. In other words, each of the minimum mark and space lengths is 3 bits in both of the EFM code and the EFMPlus code.

A typical example of the shortest run-length d=1 is the 1-7 modulation employed for optical magnetic disks. Because d=1 is assumed, the shortest mark/space length becomes 2T.

In recent years, optical disk units are also required of higher density recording performance. And, in order to meet this requirement, employment of the Partial Response Maximum Likelihood (hereinafter, to be abbreviated as PRML) comes to be under examination.

The PRML, which is an application of the conventional communication technique, has been used for magnetic disk units so as to improve the recording density. The Partial Response (PR) is a method for reproducing data while a target signal band is compressed with positive use of the mutual interference between codes (mutual interference between reproduction signals corresponding to the adjacently recorded bits). The Viterbi decoding method (ML) is a kind of so-called maximum likelihood sequence estimation method, which uses the inter-symbol interference rules of reproduction waveforms effectively to reproduce data according to the signal amplitude information obtained at plural times.

However, it has been difficult to record and reproduce data on/from any of the conventional optical disks while both high reliability and low error rate of those optical disks are satisfied.

Under such circumstances, it is an object of the present invention to provide a highly reliable optical recording/reproducing system that can always record/reproduce data at a low error rate.

SUMMARY OF THE INVENTION

The present inventor et al have analyzed and examined the above-described conventional problems. On an optical disk, the physical state usually differs between the recording mark and the space as shown in FIG. 6, so that the signal quality always comes to differ between a recording mark portion and a space portion. For example, on a phase change recording medium made on an experimental basis, the space portion becomes crystal (polycrystal) and the recording mark portion becomes amorphous when in recording data. And, the amorphous portion always has a highly uniform physical structure while the space portion is usually apt to increase noise therein due to such various factors as the variation of the polycrystal axis and the light scattering at grain boundaries. FIG. 16 shows an analysis result of the distribution of the signal fluctuation component of the above phase change recording medium. In FIG. 16, each position that is not described as a mark denotes a space. In FIG. 16, it will be found that noise components are concentrated in space portions. In this example, the noise in the space portion is about 6 dB higher than that of the mark portion. Consequently, even when microscopic marks are formed accurately, the signal quality comes to be degraded because of the signal fluctuation to occur in the spaces, thereby fast and high density recording/reproducing of data is disabled. There is another example in which recording marks are formed on a recording film made of coloring matters and an inorganic film of a write-once-read-many optical disk by making good use of the deforming of the recording film, the substrate, and the diffusion of the materials. In such a case, however, microscopic recording marks cannot be formed stably when in high density recording, so that the signal quality in such the recording marks is apt to be lower. As a result, it becomes difficult to realize fast and high density recording/reproducing of data.

In order to achieve the above object, the present invention employs a mark recording code in which the ratio between the average mark length and the average space length is changed from 1:1 so as to increase the signal components in either marks or spaces wherever is more improved in recording/reproducing signal quality.

This means that the recording code is used so that the average run-length differs between a mark portion and a space portion, because each of the mark length and the space length is fixed at run-length+one channel bit (1T). Concretely, a first state, as well as a second state that differs from the first state are formed on the recording film of the target optical disk in accordance with the RLL coding rules. And, when information is retained at the boundary between the first and second states, the average run-length of the RLL codes for recording the first state is set shorter than that of the RLL codes for recording the second state. When in phase change recording, the first state becomes crystal and the second state becomes amorphous. And, because the noise in the space portion (crystal) is larger than the noise in the mark portion (amorphous) as described above, the average space length is set shorter than the average mark length for recording information as shown in FIG. 1.

When the ratio between the average mark length and the average space length is changed from 1:1 as described above, it should be avoided to dispose a portion in which there are extremely many marks and a portion in which there are extremely less marks together in a recording track. Otherwise, the co-existence will cause a low frequency fluctuation to occur in reproduction signals and such the fluctuation will affect the servo system and/or the synchronizing system (PLL) adversely. To avoid this, it is effective to control the ratio fixedly at a value predetermined according to the medium characteristics. It is also effective for solving the problem about the average run-lengths of both mark portion and space portion.

One of the easy and simple methods for controlling the above ratio at a certain target value is controlling the DSV (Digital Sum Value) so as to get the DSV closer to a value to which a predetermined value is added at fixed time intervals when the mark portion is −1 and the space portion is 1.

Such the coding method will be capable of suppressing the low frequency component included in the code. However, because the rate of the mark portion differs from the rate of the space portion, the DC component does not become zero; it takes a predetermined value.

On the other hand, the reproduction process is divided into a process of obtaining reproduction signals from the target recording medium with use of a pick-up head, a waveform equalizing process of correcting the frequency characteristics of the reproduction signals, a gain controlling process of setting the amplitude of each reproduction signal to a predetermined value, a process of obtaining a modulated data bit string by distinguishing each reproduction signal between "1" and "0" according to a predetermined decision level, and a process of obtaining digital information by decoding each modulated data bit string in accordance with the run-length limit code rules. The decision level is controlled appropriately so that the ratio R=N1/N0 takes a predetermined value when the number of "1's" included in the modulated data bit string is assumed as N1 and the number of "0's" included in the same string is assumed as N0.

FIG. 2 shows how the signal quality is improved when the ratio between mark and space is changed. In FIG. 2, a total noise level difference is calculated between when the noise in the space portion is 5 dB higher than that in the mark portion and when the noise in the space portion is 10 dB is higher than that in the mark portion. The total noise of both mark and space portions is represented by the following expression.

$$Ntotal = (Pmark \times (Nmark)^2 + Pspace \times (Nspace)^2)^{1/2} \qquad \text{Expression 1}$$

where each symbol has the following meaning:

Pmark: Rate of the mark portion
Pspace: Rate of the space portion
Nmark: Noise level in the mark portion
Nspace: Noise level in the space portion As shown in FIG. 2, for example, if the noise level in the space portion is 10 dB higher than that in the mark portion and the rate of the space portion is reduced by 20% to 0.3, then, the noise level can be reduced by about 2 dB.

As a result of the investigation of well-known examples carried out after the completion of this specification, the present inventor et al found JP-A No. 163887/2000. This official gazette describes that modulation is done for modulated data selected so that each of a bit string corresponding to a mark string and a bit string corresponding to a space string comes to have only a value quantized at a predetermined size within a range that satisfies both minimum and maximum lengths of the RLL and reproduction errors are checked according to the quantization condition at the time of demodulation. This official gazette does not describe any code that enables the average run-length to differ between the mark portion and the space portion while the present invention employs such the code.

BRIEF DESCRIPTION OF THE DRAWINGS

FIG. 4 is a recording code employed in the embodiment of the present invention;

DETAILED DESCRIPTION OF THE PREFERRED EMBODIMENT

First Embodiment

Figure 3:
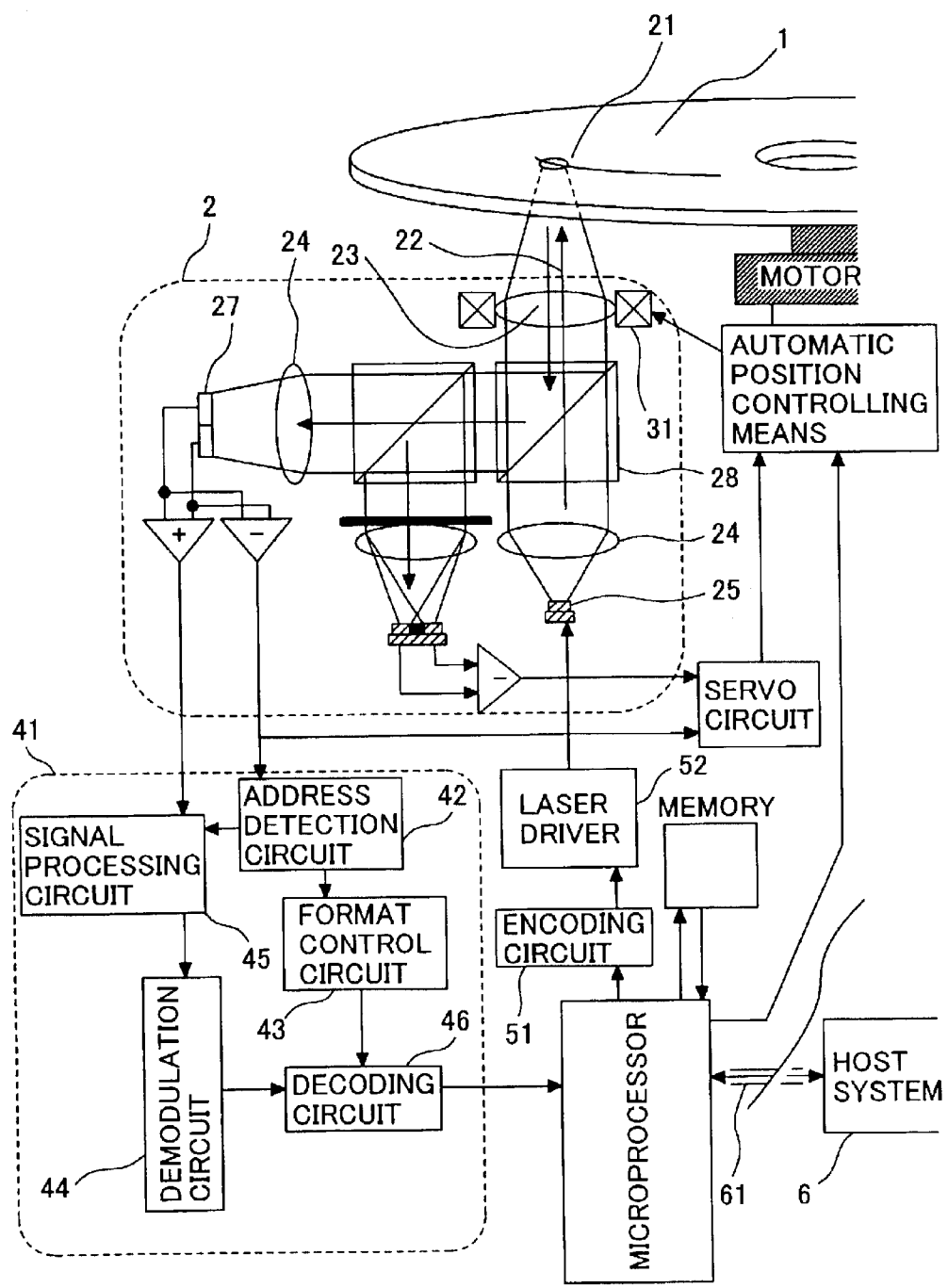
FIG. 3 is a block diagram of an optical disk system in an embodiment of the present invention.

FIG. 3 shows a schematic block diagram of an optical disc unit in an embodiment of the present invention. As to be described below, the optical disk unit may be used as a storage unit of a computer system or connected to a TV set and used as a stationary type image/voice recording/reproducing apparatus. The optical disk may also be used as a recording/reproducing apparatus for a portable video camera, portable music player, or the like.

In FIG. 3, a host system 6 is such an application equipment as a host computer or video controller that may be a personal computer. An encoding circuit 51 modulates user data received from the host system 6 through a host interface 61 according to predetermined rules and converts the data so as to be recorded on a recording medium 1 (this processing is referred to as encoding).

A laser driver 52 receives encoded data from the encoding circuit 51 and converts the data to a voltage waveform appropriately to drive a laser beam source 25 located in a recording/reproducing head 2. The recording/reproducing head 2 converts the received voltage waveform to a laser beam through the laser beam source 25. The laser beam passes through a collimator lens 24 to become a parallel light beam 22, then focused by an objective lens 23 to form a beam spot 21 on the disk-like medium 1, which is used to write marks on the medium 1. At this time, an actuator 31 drives the objective lens 23 to control the position of the beam spot 21. Such the data recording is usually done by making good use of the temperature of the medium recording film to be raised by the light energy of the beam spot 21. This is common to phase change recording media such as the rewritable DVD media and coloring matter recording media such as the write-once-read-many CD media.

To read data from the medium 1, the reflection light from the beam spot 21 is guided to the reproducing system by a beam splitter 28, then focused by a lens 24 and detected by a detector 27. At this time, the light reflection intensity difference between the mark portion and the space portion, as well as the reflection light are used to read the data, then the read information is converted to electrical information. The electrical information (signals) is amplified by a recording/reproducing amplifier properly, then sent to a reproducing block 41.

The reproducing signal inputted to the reproducing block 41 is sent to a signal processing circuit 45 and subjected to such proper signal processes as waveform equalization and filtering (band limitation). The processed signal is then subjected to an analog-digital conversion (sampling) process and converted to amplitude information (digital), then sent to a demodulation circuit 44. The signal is then subjected to Viterbi (ML) modulation in the demodulation circuit 44 to generate the maximum likelihood data sequence.

The obtained data string is subjected to a code conversion process in the demodulation circuit 46 (in contrast with that of the encoding circuit 51) to restore the original data. The difference signal output from the detector 27 is converted to address information in the address detection circuit 42. At the time of restoring the original data, a timing signal generated in the format control circuit 43 in accordance with the data structure is used.

In the optical disk unit, data is recorded/reproduced such way in the above-described procedures.

In this embodiment, the demodulation circuit 44 uses a PR (121). In other words, waveform equalization and Viterbi decoding are done in the data reproduction circuit assuming that a 3-bit impulse response (1, 2, 1/−1, −2, −1) is returned to a single-bit mark/space (1/−1). If the PR (121) is used at this time, the Euclidean distance 4 error becomes the least Euclidean distance error.

An error occurrence frequency is a Euclidean distance function and the error occurrence possibility goes low in proportion to an increase of the Euclidean distance. For example, when the error occurrence possibility of the error having 4 as the square of the Euclidean distance is $4 \times 10^{-3}$ ($10^n$ denotes the n-square of 10), the error occurrence possibility of the error having 6 as the square of the Euclidean distance becomes about $6 \times 10^{-4}$. If the S/N ratio and the error rate are favorable values respectively, the ratio between the error occurrence rate when the square of the Euclidean distance is 4 and the error occurrence rate when the square of the Euclidean distance is 6 is apt to further become wider. Consequently, if it is possible to eliminate the error occurrence pattern having a small Euciidean distance logically with use of the run-length limit code, the error occurrence comes to be suppressed.

If the PR (121) is used at this time, the error pattern having 4 as the square of the Euclidean distance becomes $\pm(1, -1)$ or $\pm(1, -1, 1(-1, 1)^m)$ and both include $\pm(1, -1)$. Here, it is premised that the error pattern is occurred to the mark/space (0/1). If a mark portion 0 is decided as a space portion 1 (error decision), the error pattern becomes 1 and if a mark portion 1 is decided as a mark 0 (error decision), the error pattern becomes −1. If a mark has the least code and the space length is 2 or above, the $\pm(1, -1)$ error pattern never occurs and the Euclidean distance 4 error can be eliminated. Consequently, the error occurrence rate is suppressed. The PR class may be replaced with another one if it can have an impulse response of 3 bits or more.

Figure 5:
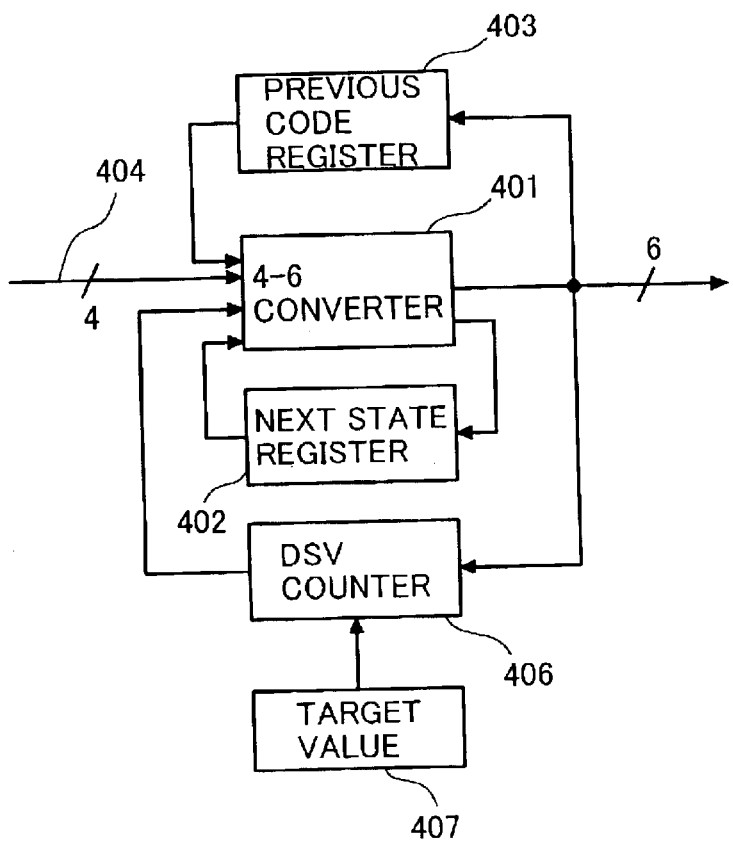
FIG. 5 is a block diagram of an encoding circuit in the embodiment of the present invention.
Figure 6:
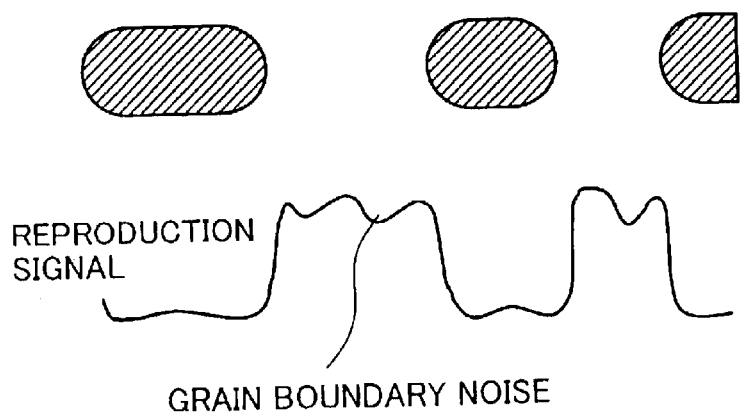
FIG. 6 is a chart for describing a difference of noise between the mark portion and the space portion of an optical disk.

The codes used in this embodiment are generated by the encoding circuit shown in FIG. 5 with use of the conversion table shown in FIG. 4. At this time, the encoding circuit is provided with a function for assuming 2 for both of the shortest mark length and the shortest space length respectively. Data is written on the recording medium so that each 0 portion in each code string output from the encoding output 405 shown in FIG. 5 becomes a mark and each 1 portion becomes a space. The codes used in the present invention are (1, 10) RLL codes that are limited in runlength between edges if the boundary (edge) between mark and space is noticed specially.

Hereinafter, "0" and "1" described in this embodiment denote data described in the NRZ representation method. Concretely, "0" and "1" correspond to a mark and a space directly.

Next, the configuration and operation of the encoding circuit shown in FIG. 5 will be described. The encoding circuit 51 includes a 4-6 converter 401, a next state register 402, a DSV counter 406, and a previous codeword register 403. The next state register 402, the DSV counter 406, and the previous codeword register 403 are all initialized to "0" in the initial status. The next state register 402 stores a state to be used in the next conversion. The previous codeword register 403 stores a codeword for 6 bits output from the 4-6 converter.

Then, the vaLue of (the number of 1's×1+(the number of 0's)×(−1)+1) is added to the value of the DSV counter 406 according to the code string output from the 4-6 converter 401. The value of the target value register 407 is subtracted from the DSV counter 406 at each symbol conversion.

The target value register. 407 stores a control target DSV per symbol. In this example, the control target value is 0.5. The DSV counter usually has two extra bits (0.5 and 0.25 places) in the lower part of the LSB so as to store each value in units of 0.25. When the target value is subtracted, the DSV register comes to store a difference Δ between the DSV and the target value, not the codeword DSV itself.

The 4-6 converter 401 converts data with reference to the conversion table shown in FIG. 4 according to the values of the next state register 402 and the DSV counter 406, as well as the user data inputted thereto through a signal line 404. The DSV is controlled in accordance with the following logics at each 4-6 conversion.

(1) When the value in the next state register is 1 or 2 and the input data is 0 or 1: The value is selected between the values in both main and sub conversion tables so that the value obtained by adding the DSV in the conversion tables to the DSV counter value becomes closer to 0.
(2) When the value in the next state register is 3 or 4:
   (a) The codeword of the state 3 or the state 4, whichever satisfies both d and k restrictions at a connecting portion with the previous codeword is selected.
   (b) When there are two codewords that can satisfy the above d and k restrictions, the target value is selected between the values in both main and sub conversion tables so that the value obtained by adding the DSV in the conversion table to the DSV counter value goes closer to 0. This method can generate codes, each enabling the DSV per codeword to become 0.5 of the target value.

Figure 7A:
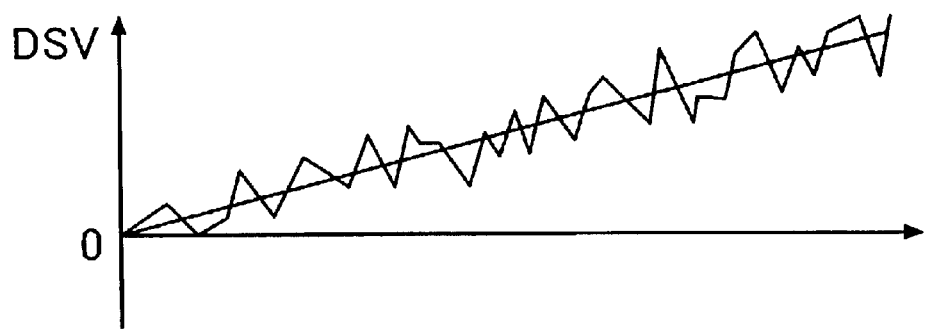
FIG. 7 is graphs for describing the concept of the DSV controlling of the present invention.
Figure 7B:
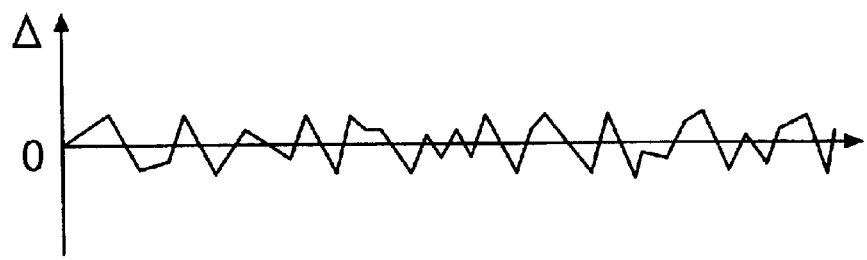

FIG. 7 shows graphs for describing changes of the DSV of a code generated by this encoding circuit, a difference Δ between the DSV and the target value (0.5 per codeword) It will be understood from FIG. 7 that the DSV is controlled so as to go around the target value.

Figure 8:
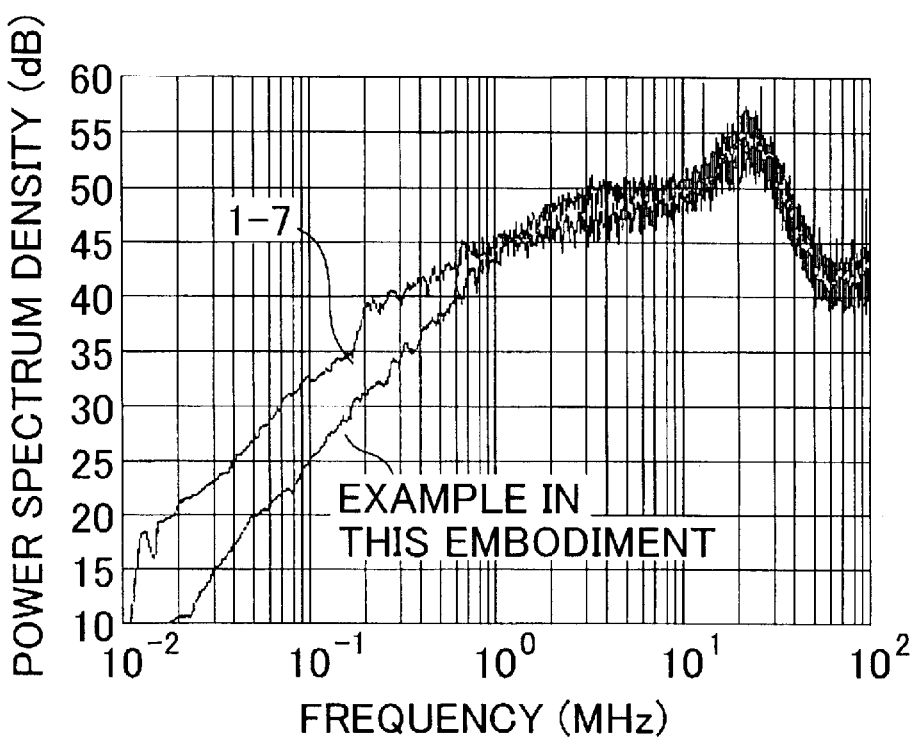
FIG. 8 is a graph for describing the effect for suppressing the low frequency range spectrum in the embodiment of the present invention.

FIG. 8 shows a graph of the signal spectrum of a codeword generated by the encoding circuit in this embodiment. FIG. 8 also shows the signal spectrum of the 1-7 modulation in a conventional example for comparison. It will be understood that the method in this embodiment suppresses the low frequency component more effectively. This is why this embodiment can configure a reproducing circuit capable of suppressing the noise components in such a low range as that of the disk rotation fluctuation effectively and easily, since the servo is stable at the recording/reproducing time and free of disturbance to be caused by signals even when a high follow-up band is set for the PLL circuit that generates a clock by following up the target signal phase at the time of reproducing and the level follow-up circuit that follows up the signal level fluctuation. In other words, data can be reproduced easily at a high S/N ratio.

Figure 9:
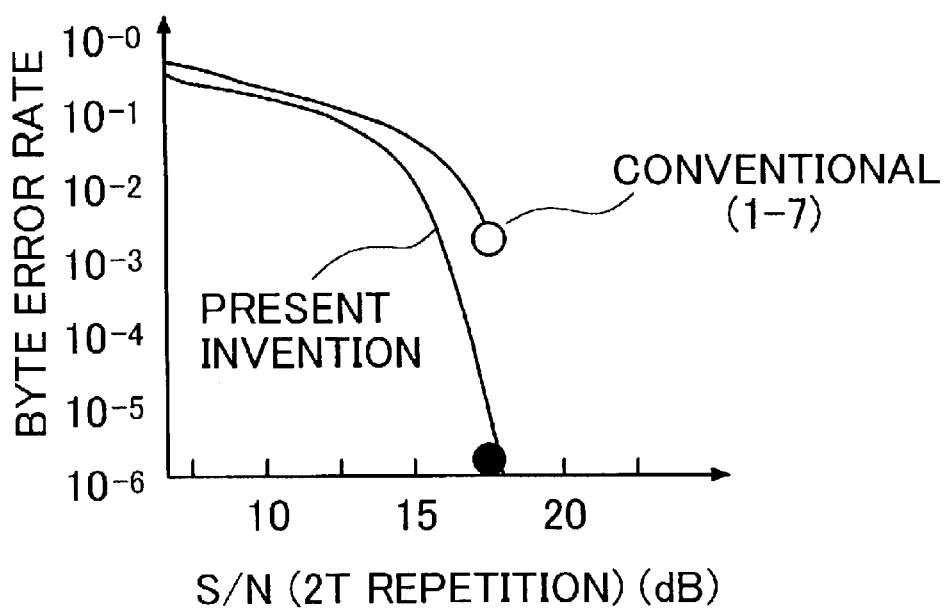
FIG. 9 is a graph for describing the effect of the present invention.
Figure 16:
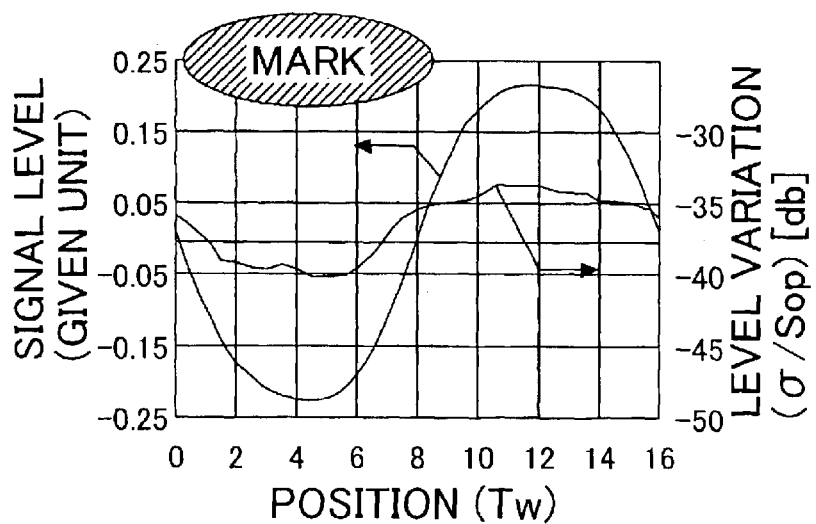
FIG. 16 is a graph for describing the noise distribution of a recording medium in the embodiment of the present invention.

FIG. 9 shows a graph for describing an error rate when data is actually recorded on a phase change optical disk with use of the codes employed in this embodiment. FIG. 16 shows an analysis result of the noise in each of the mark and space portions of this disk manufactured on an experimental basis. It will be understood from FIG. 9 that the noise level in the space portion is about 6 dB higher than that in the mark portion.

Using the codes employed in this embodiment will therefore make it possible to control the DSV per codeword at about 0.5 as described above. Because one codeword is 6 bits in length, it becomes 3025: 2.76 in terms of a ratio between mark and space (3.25−2.75=0.5). This is equivalent to 3.25/6×100=about 54% of the mark's duty ratio. At this time, the average noise level is reduced by about 0.5 dB than that shown in FIG. 2. Of course, when the mark's duty ratio further increases, that is, the space ratio further decreases, the average noise level can further decrease as shown clearly in FIG. 2. For example, when the mark's duty ratio is 64%, the average noise level is reduced by about 1 dB.

On the contrary, when a disk having a noise level in the mark portion, which is about 6 dB higher than that in the space portion, is used and the mark's duty ratio is set to about 46% (=2.75/6×100) or under, then the noise level is reduced similarly by about 0.5 dB or over.

An error rate was measured in recording/reproducing on a experimentally-manufactured disk with use of the codes employed in this embodiment. At that time, the recording/reproducing conditions ware as follows; an optical system in which a laser having a wave length of 405 nm and a NAO.85 objective lens were mounted was used and data was recorded in a line density of 0.09 µm/bit on the disk constituted of lands and grooves at track pitches of about 0.28 µm. The linear speed at this time was about 4.5 m/s and the reproducing power was 0.3 mW. At that time, the recording capacity was equivalent to about 35GB on a 120-mm disk. The error rate measurement result was as follows; the error rate was about 1/1,000,000 as shown in FIG. 9, but the error rate was worsen by three figures as shown in FIG. 9 when the conventional 1-7 modulation was employed for the measurement. At that time, both of the 2T repetitive signals were 2T=0.12 µm, so that the S/N ratio was about 18 dB respectively. When the reproducing beam was reduced intentionally under the conditions, the S/N ratio was degraded as the signal light amount dropped. The solid line in FIG. 9 shows a relationship between the S/N ratio and the error rate at that-time. The graph shown in FIG. 9 also shows that the present invention can reduce the error rate by about 2 dB in terms of the S/N ratio. Because the noise reduction effect itself described above is about 0.5 dB, the remaining 1.5 dB is caused by the low frequency signal component suppression effect.

Second Embodiment

Figure 10:
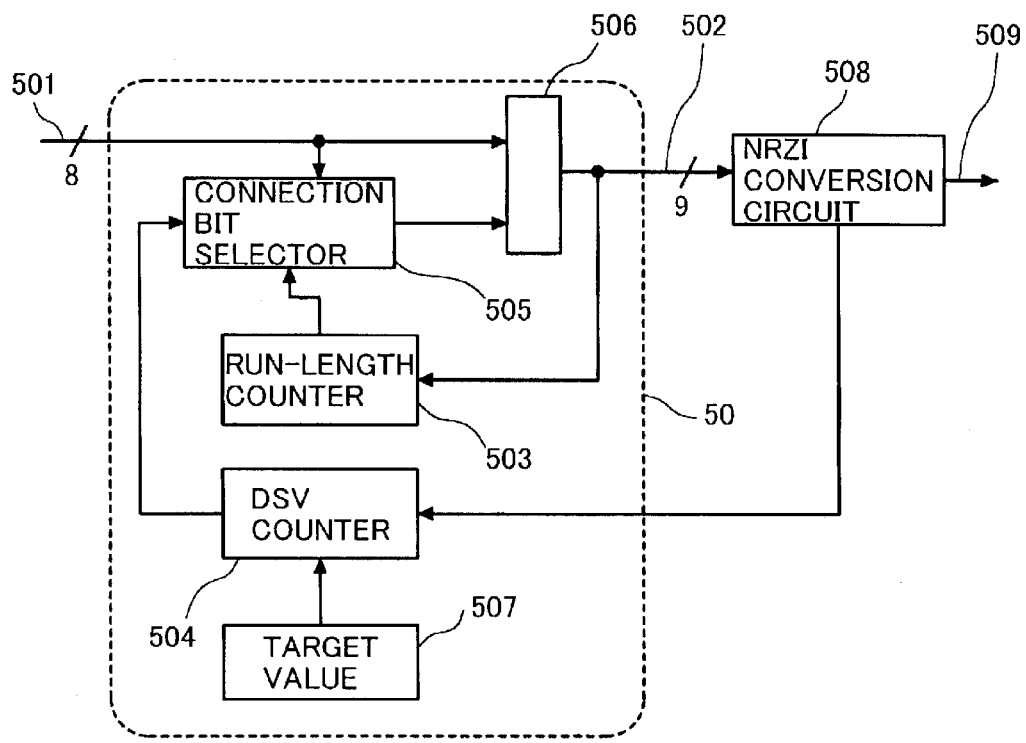
FIG. 10 is an encoding circuit in the embodiment of the present invention.

FIG. 10 shows an encoding circuit in another embodiment of the present invention. The codes employed in this embodiment are (0.8) RLL codes to be subjected to the 8/9 conversion that converts 8-bit user data to 9-bit data. Because d=0 is assumed, the shortest mark/space length is 1T.

An encoding circuit 50 is configured by a DSV counter 504, a run-length counter 503, a connection bit selector 505, a synthesized output circuit 50, and a target value register 507. The connection bit selector 505 decides a connection bit between the inputted user data, which is a previous output codeword 502, according to the input user data 501, the DSV counter output 504, and the run-length counter 503 value.

The run-length counter counts the last run-length (the number of consecutive 0's) of the previous codeword and retains the count value. The DSV counter calculates an NRZI-converted DSV and retains the value. Similarly to the first embodiment, in this connection, the target value retained in the target value register 507 is subtracted at each symbol=8 bits.

Next, a description will be made for concrete operations of the connection bit selector 505. The connection bit selector 505 adds up the previous run-length counter value and the run-length. (the number of consecutive 0's) of the start of inputted user data, then evaluates the value of the added-up value +1. If the evaluated value is greater than 8, the selector 505 selects 1 unconditionally as the connection bit. If the evaluated value is less than 8, the selector 505 calculates the NRZI-converted DSV in each of the cases in which 1 is selected and in which 0 is selected as the connection bit, from the previous DSV and the inputted user data pattern to make comparison between the two DSVs. The selector 505 then selects the DSV that becomes smaller as the connection bit.

After this, the selected connection bit and the user data are synthesized in the synthesized output circuit 506, then the result is sent to the NRZI conversion circuit 508 and subjected to NRZI conversion through an exclusive-OR operation for adjacent bits therein. The result is then output as a recording data sequence 509. In this sequence, a single connection bit is added to each inputted 8-bit user data, so that 9 bits are output totally. The encoding rate thus becomes 8/9. And, because the connection bit is selected so that the run-length does not exceed 8, k=8 is assumed and the code becomes a (0, 8) RLL code.

In this example, it is possible to set a target value between 3.5 and −3.5. (If the target value goes out of the range, the code space comes to run short. As a result, the DSV controlling is disabled.)

Figure 1:
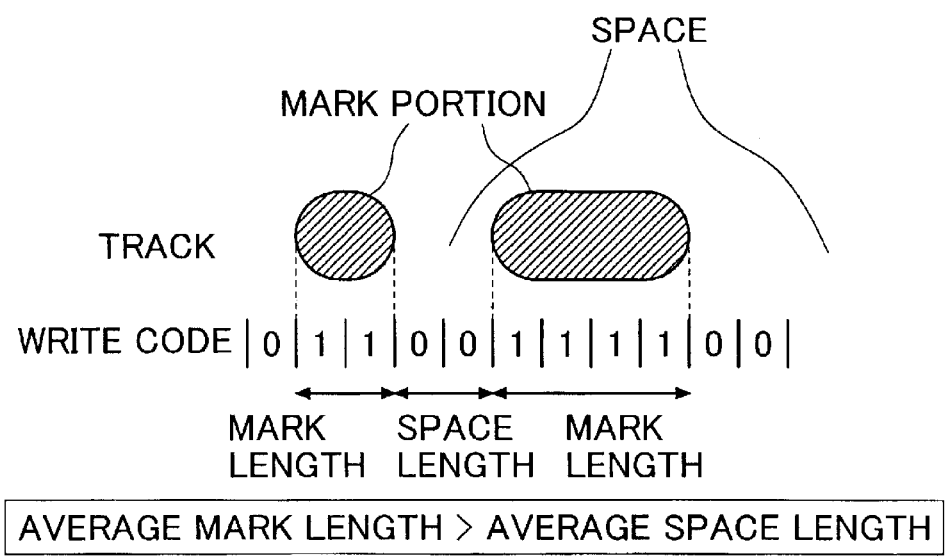
FIG. 1 is a chart for describing a relationship between the recording mark portion and the space portion of the present invention.
Figure 2:
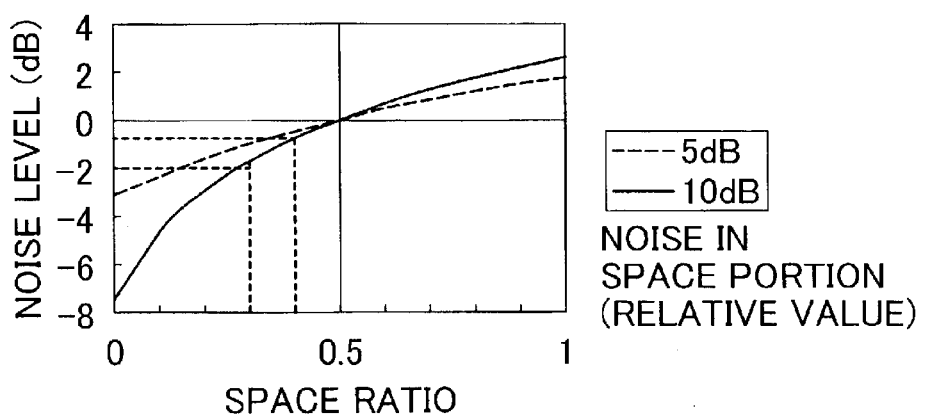
FIG. 2 is a graph for describing the principle of the present invention.

The encoding circuit in this embodiment can be used as part (encoding circuit 51) of the recording/reproducing system shown in FIG. 3 just like in the first embodiment. If a target value is set at 2.5 for the operation of the encoding circuit in this embodiment, the mark-space duty ratio per symbol becomes 5.75: 3.25 (2.5=5.75−3.25). And, because one symbol is converted to a 9-bit codeword, the mark duty ratio becomes 5.5/9×100%=about 64%. If the optical disk (the noise level in the space portion is 6 dB higher than that of the mark portion) employed in the first embodiment is used, therefore, the S/N ratio is improved by about 1 dB as shown in FIG. 2.

Third Embodiment

Figure 11:
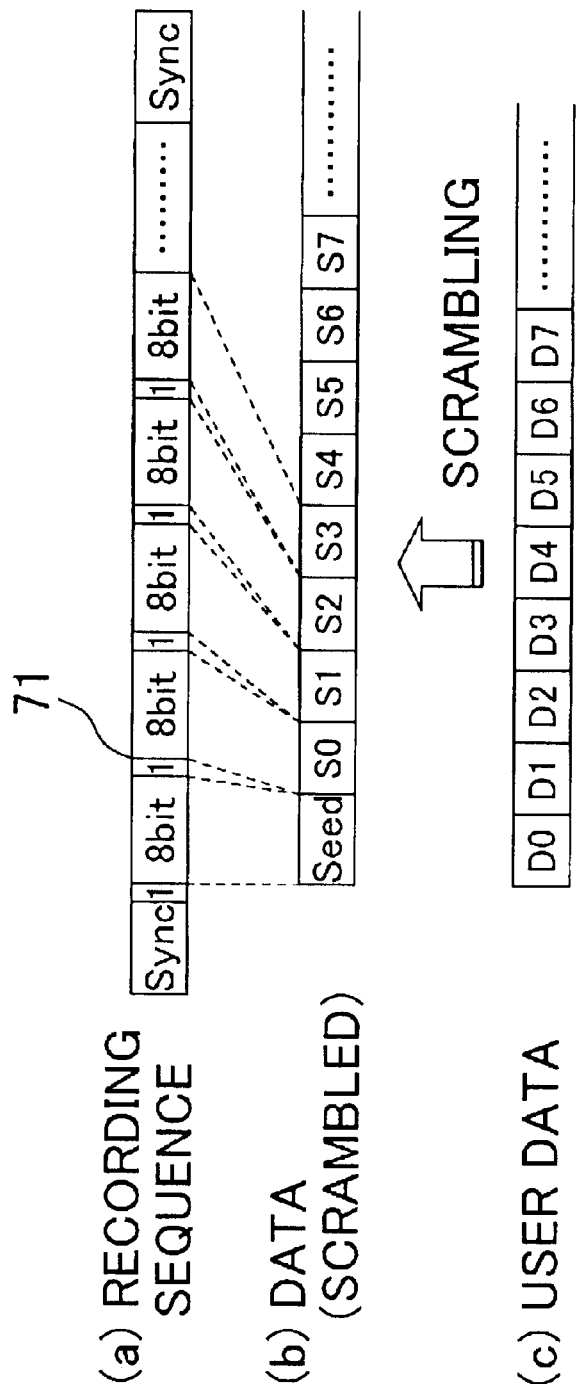
FIG. 11 is a data format employed in the embodiment of the present invention.

In this third embodiment, each recording code used in the second embodiment is combined with scrambled user data. FIG. 11 shows a recording data format. User data (c) is scrambled, then one connection bit 71 is added to each 8-bit user data and converted to a (0, 8) RLL code through the above-described 8/9 conversion, then the converted user data is recorded. In this third embodiment, single-byte "seed" data is added to each 112-byte user data, then the result is scrambled to 113-byte data, which is then converted to a 11.3×9=1017-bit recording data sequence through 8/9 conversion. At the start portion of each recording data is disposed a 27-bit sync mark (SYNC). A sync frame is thus composed of 1044 bits totally. The sync is composed of a set of an IOT mark and an IOT space in the data sequence, as well as a number portion. The number portion is used to decide the continuity of the sync frame and/or fix the frame position in the corresponding error correction block for synchronization. Although not described in detail here, one error correction. (ECC) block is composed of 640 sync frames in this example. The ECC block includes original data composed of a total of 71680 bytes. The user can use only 65536 bytes of those bytes and the remaining bytes are used for error correction parity and ID data. The total format utilization efficiency, when the sync, etc. are included, becomes 88.3%.

Figure 12:
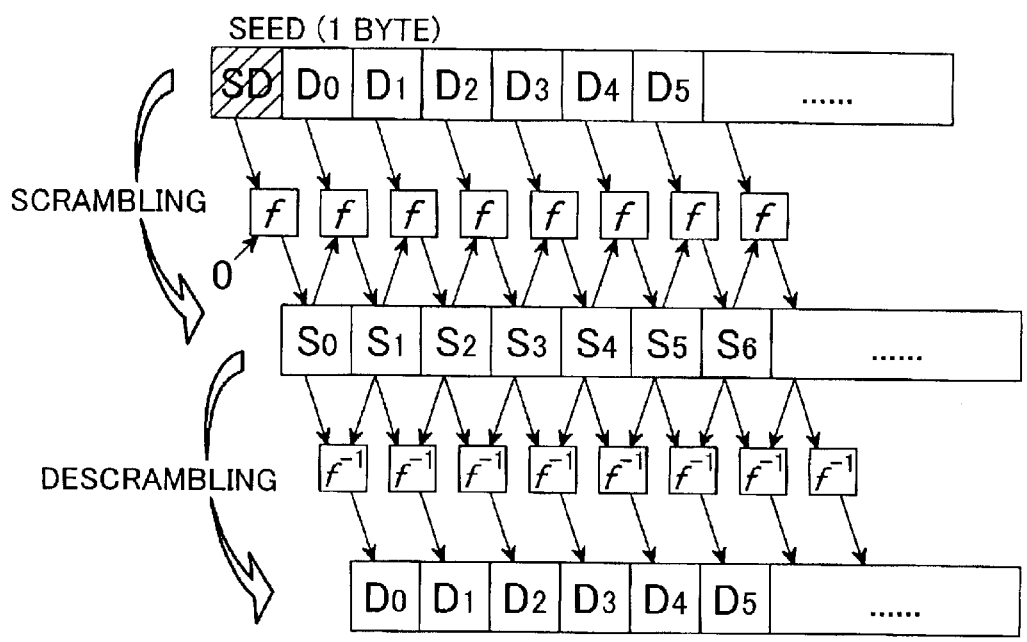
FIG. 12 is a chart for describing the operation concept of a scrambling device in the embodiment of the present invention.
Figure 13:
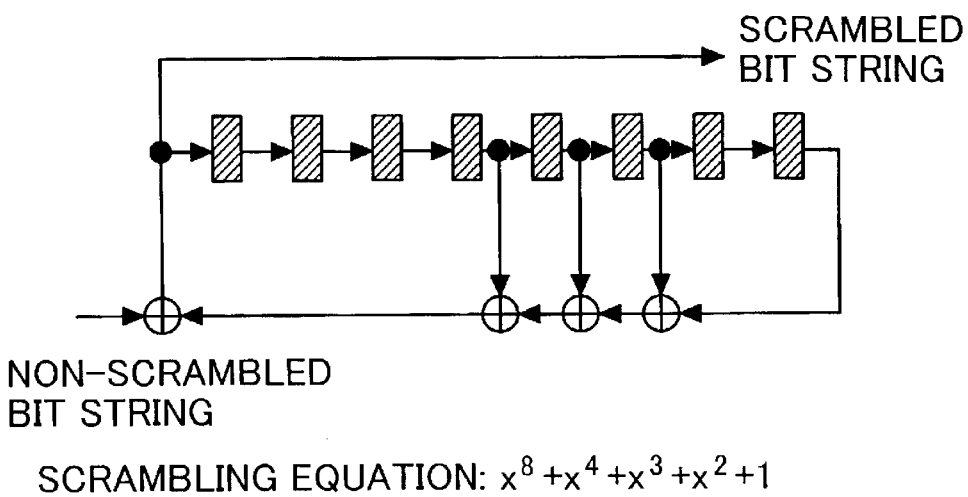
FIG. 13 is a block diagram of the scrambling device in the embodiment of the present invention.

FIG. 13 shows a scrambling circuit in this third embodiment and FIG. 12 shows the operation principle of the scrambling circuit. At first, user data, after a given seed byte is added to the start thereof, is inputted to the scrambling circuit shown in FIG. 13. At this time, the scrambling circuit makes calculation between scrambled user data and the next user data bytes. Consequently, when in descrambling, the scrambling circuit is just required to make a reversal calculation for the user data. Thus, there. is no need for the scrambling circuit to know the seed value at the time of descrambling. In other words, descrambling is enabled only with the fixed algorithm regardless of the seed value. At the time of recording, therefore, any seed value can be selected.

Figure 14:
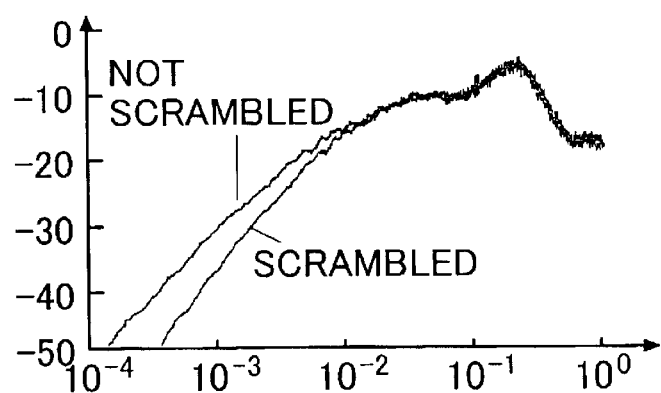
FIG. 14 is a graph for describing the effect for suppressing the low frequency range spectrum in the embodiment of the present invention.

Because the seed value can be selected freely in this embodiment as described above, a plurality of types of seeds can be used for attempting signal modulation, so that recording is made just by selecting one of a plurality of. obtained modulated data sequences, which has the least variation in DSV and run-length. In this embodiment, selection of a modulated data sequence is done in frames. The uniformity of recording data sequences is thus improved. FIG. 14 shows two recording code spectra; one spectrum shows a case in which the recording codes in he second embodiment are used as are and the other spectrum shows another case, in which the recording codes used in the second embodiment are scrambled. It will be understood that the method in this embodiment can suppress the low frequency components more effectively.

A comparison was made for reproducing characteristics among the following three cases; the recording codes/format in this third embodiment was used for recording/reproducing in the first case, the conventional ordinary 8/9 conversion (mark/space duty is controlled to 1:1) was used for recording/reproducing in the second case, and the second embodiment (the duty was controlled to 64%) was used for recording/reproducing in the third case. The recording/reproducing conditions at this time were as follows; An optical system in which a laser having a wave length of 405 nm and an NAO.85 objective lens were mounted was used and data was recorded/reproduced on a disk constituting of lands and grooves disposed at track pitches of about 0.25 µm while the recording density was changed within a range from 0.12 µm/bit to 0.070 µm/bit. The linear speed was about 4.5 m/s and the reproducing power was 0.3 mW.

Figure 15:
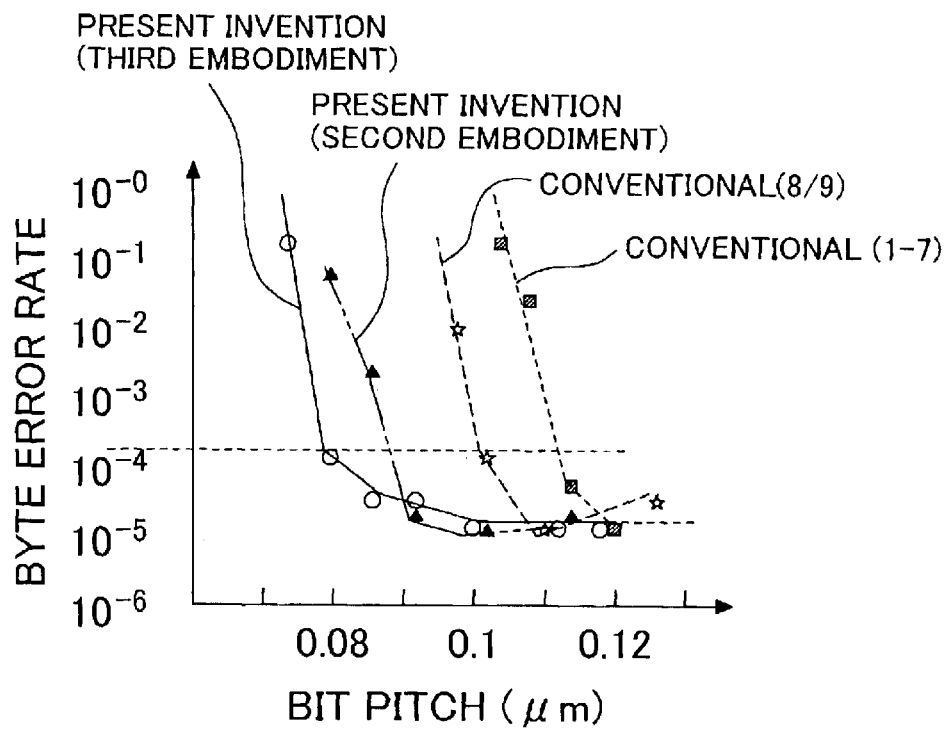
FIG. 15 is a graph for describing the effect of the present invention.

FIG. 15 shows the measurement result. It will be found that the method in this embodiment is always low in error rate and the recording/reproducing characteristics are more excellent than other methods. In this embodiment, the recording density, when the error rate is $10^{-4}$, becomes 0.08 µm/bit. The recording capacity at that time is equivalent to about 56GB of the 120-mm disk when the format efficiency is taken into consideration. This means that this embodiment can improve the recording density by about 1.4 times the conventional one.

The byte error rate mentioned here denotes a value assumed before the error correction is done. Generally, any error correction method can suppress the byte error rate of $10^{-2}$, to $10^{-3}$, to $10^{-12}$ or under.

Actually, user data should preferably be scrambled by multiplying the user data by arbitrary M-sequence or the like before the scrambling of this method is made so that the uniformity of data sequences, each consisting of some scramble words, is improved. The seed data may not be one byte necessarily; for example, part of sync data may be used as seed data so that the format efficiency is improved.

Fourth Embodiment

Figure 17:
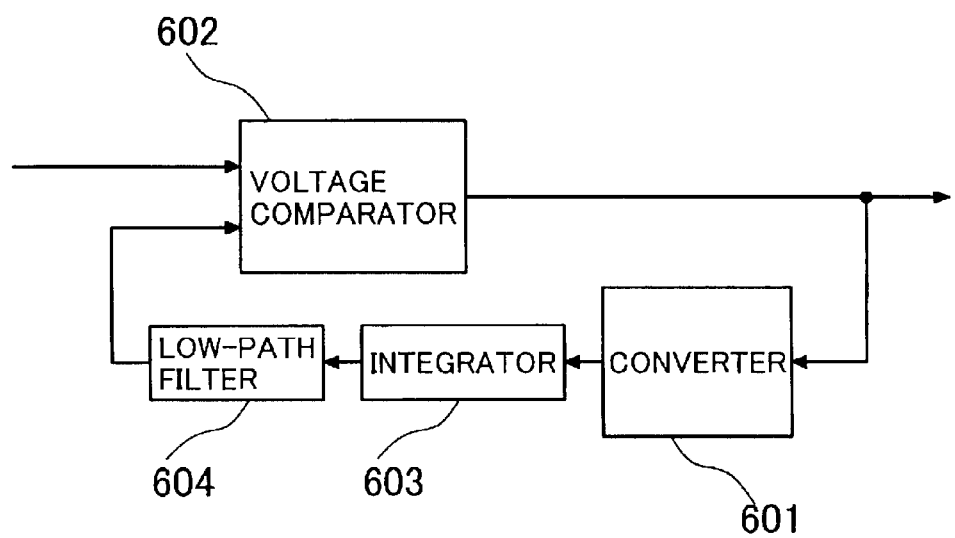
FIG. 17 is a block diagram of a signal demodulation circuit in the embodiment of the present invention.

FIG. 17 shows a demodulation circuit in the fourth embodiment of the present invention. This demodulation circuit is configured by a modulator 601, a voltage comparator 602, an integrator 603, and a low-path filter 604.

In this embodiment, data is recorded on the target recording medium so that the ratio between mark and space becomes 3.25: 2.75. This ratio is equivalent to a mark duty ratio, which is 3.25/6×100=about 54%.

Reproducing signals from the recording medium (optical disk) are inputted first to the voltage comparator 602. In addition to the reproducing signals, the voltage comparator 602 also receives comparison level signals for making a comparison between voltages, that is, between "0" and "1" decision level signals. The voltage comparator 602 compares each reproducing signal with a decision level at each channel clock. The comparator 602 outputs "0" when the reproducing signal value is less than the decision level and "1" when the signal value is greater than the decision level.

In the case of the phase change recording medium used in this embodiment, the reflection rate of the mark portion is lower than that of the space portion. The reproducing signal level thus becomes low in the mark portion arid high in the space portion. Consequently, the voltage comparator 602 outputs "0" from each mark portion and "1" from each space portion.

Each data string output from the voltage comparator 602 is inputted to the converter 601 at a channel clock. The converter 601 counts the number of "0's" and the number of "1's" inputted for a fixed time respectively. The converter 601 outputs a positive level signal when the rate of "0" is lower than 54% and a negative level signal when it is higher than 54%. The output of the converter 601 is integrated by the properly constant-selected integrator 603 and the low-path filter respectively until the above decision level is reached. The integrated value is then inputted to the voltage comparator 602.

If the rate of "0" is lower than 54%, the decision level rises, thereby the rate of "0" increases. If the rate of "0" is higher than 54%, the decision level falls, thereby the rate of "0"decreases. The rate of "0" is controlled such way so as to go closer to 54%.

Because the rate of "0" output from the voltage comparator 602 is controlled such way so that the rate of "0" goes closer to 54%, the recording method in this fourth embodiment can demodulate recorded data correctly so that the mark duty ratio becomes 54%.

Fifth Embodiment

Figure 18:
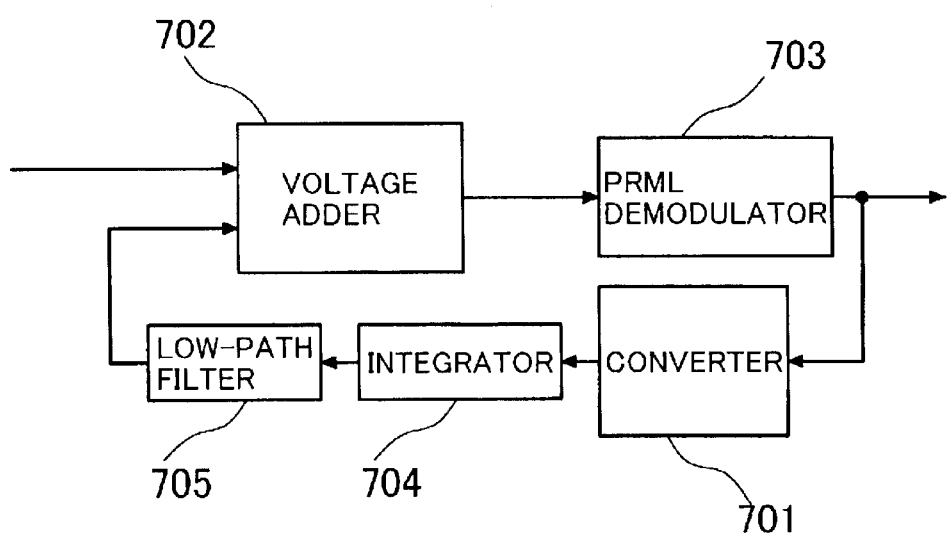
FIG. 18 is a block diagram of a signal demodulation circuit in the embodiment of the present invention.

FIG. 18 shows a modulation circuit in this fifth embodiment of the present invention, which uses the PRML. This modulation circuit is configured by a voltage adder 702, a PRML demodulator 703, an integrator 704, and a low-path filter 705. In this fifth embodiment, the voltage comparator located in the demodulation circuit in the fourth embodiment is replaced with a block composed of the voltage adder 702 and the PRML demodulator 703.

Reproducing signals read from an optical disk are inputted to the voltage adder 702. In addition to the reproducing signals, the voltage adder 702 also receives an addition signal to be added to each reproducing signal. Each reproducing signal, after an addition signal is added thereto in the voltage adder 702, is output to the PRML demodulator 703. The PRML demodulator 703 used in this fifth embodiment is the same as that in the first embodiment.

Just like the recording medium used in the fourth embodiment, the phase change recording medium used in this fifth embodiment has a lower reflection rate in the mark portion than in the space portion. Consequently, the reproducing signal level comes to be low in the mark portion and high in the space portion.

The converter 701 counts the number of "0's" and the number of "1's" inputted for a fixed time respectively. The converter 701 outputs a negative voltage level signal when the rate of "0" is less than 54% and a positive voltage level signal when the rate of "0" is greater than 54%.

The output of the converter 701 is integrated by the properly constant-selected integrator 704 and the low-path filter 705 respectively and the result (the above addition signal) is inputted to the voltage comparator 702.

When the rate of "0" is less than 54%, the addition signal level falls, thereby the rate of "0" increases. On the contrary, when the rate of "0" is greater than 54%, the addition signal level rises, thereby the rate of "0" decreases. The rate of "0" is controlled such way so as to go closer to 54%.

Because the rate of "0" output from the voltage comparator is controlled such way so that the rate of "0" goes closer to 54%, the above recording method can modulate recorded data correctly so that the mark duty ratio becomes 54%.

The form and effect of the embodiment of the present invention are not limited only to those described above, of course.

The recording medium described above is not limited only to the phase change type one used in the above embodiments; it may be a recording medium dedicated to reading, which records information in embossed pits. In addition, the noise level in the space portion is not necessarily higher than that in the mark portion even while the phase change type recording medium is so; for example, the recording medium may be any of such recording media as write-once-read-many recording media made of coloring matters and inorganic film or optical magnetic recording media, in which the noise level in the mark portion is higher. While the (1,10) modulation and (0,8) modulation are employed for recording signals in the above embodiments, another method, for example, any of the EMF modulation method and the EMFPlus (2,7) modulation method may be. employed. And, while the PR121 is used for reproducing data in the above embodiments, another class one may be used. For example, any of PR1111, PR1221, and PR(−1,0,1) may be used. The laser wave length used for recording/reproducing in the above embodiments may be replaced with any one of which length is within 630 and 650 nm. The head aperture ratio may be any of 0.65 and 0.75.

As described above, according to the present invention, therefore, it is possible to provide a recording/reproducing method for recording/reproducing information at a high S/N ratio so as to realize the maximum S/N ratio of the media, thereby realizing a fast and high density optical disk system.

What is claimed is:

1. An information recording method for retaining information at a boundary between first and second states formed on a recording film in accordance with the RLL coding rules, said first and second states being different from each other, wherein the average run length of said RLL code for recording said first state is shorter than that for recording said second state.

2. The method according to claim 1, wherein said first state is crystal and said second state is amorphous.

3. The method according to claim 1, wherein data used to record said information is scrambled.

4. An information recording method for recording information on an information recording medium so that a state corresponding to data "1" and a state corresponding to data "0" are recorded as different physical states by means of the NRZ representation method, wherein the noise level differs between said state corresponding to "1" and said state corresponding to "0"; and wherein said state corresponding to "1" or said state corresponding to "0", whichever is lower in said noise level, is recorded as said information with use of a modulation code capable of recording more of said information on said information recording medium.

5. The method according to claim 4, wherein said modulation code is a run-length limit code;

wherein said modulation code is used to satisfy N1>N0 at DN1<DN0 and N1<N0 at DN1>DN0 and fix the rate R=N1/N0 approximately in the case where the noise level in a state corresponding to "1" is decided as DN1 and the noise level in a state corresponding to "0" is decided as DN0 while the number of "1's" included in a modulation data bit string is N1 and the number of "0's" included in the same string is N0 upon converting of a user data bit string to a modulated data bit string.

6. The method according to claim 5,
wherein said rate R is 54%<R or R<46%.

7. The method according to claim 5,
wherein said rate R is controlled so that the accumulated charge goes closer to 0, thereby fixing said rate R approximately.

8. The method according to claim 4,
wherein said data used to record said information is scrambled.

9. An information reproducing method for reproducing information from an information recording medium,
wherein reproducing signals are obtained by irradiating a beam on said information recording medium on which said information is recorded and retained at each boundary between first and second states so that the average run length of the RLL code for recording said first state become shorter than that for recording said second state; and
wherein said reproducing signals are decoded to digital information, thereby reproducing said information.

10. The information reproducing method according to claim 9,
wherein a process for reproducing said information includes;
a process of applying waveform equalization for said reproducing signals to compensate the frequency characteristics;
a process of controlling a gain to make the amplitude of each of said reproducing signals to a fixed value;
a process of distinguishing each of said reproducing signals between,"1" and "0" according to a predetermined distinguishing level; and
a process of decoding said demodulated data bit string to digital information in accordance with the run length limit code rules;
wherein said distinguishing level is controlled so that the rate R=N1/N0 takes a predetermined value when it is assumed that the number of "1's" included in said demodulated data bit string is N1 and the number of "0's" included in the same string is N0.

* * * * *